(12) United States Patent
Cagliani

(10) Patent No.: US 12,105,136 B2
(45) Date of Patent: Oct. 1, 2024

(54) METHOD FOR DETERMINING MATERIAL PARAMETERS OF A MULTILAYER TEST SAMPLE

(71) Applicant: KLA CORPORATION, Milpitas, CA (US)

(72) Inventor: Alberto Cagliani, Copenhagen (DK)

(73) Assignee: KLA CORPORATION, Milpitas, CA (US)

( * ) Notice: Subject to any disclaimer, the term of this patent is extended or adjusted under 35 U.S.C. 154(b) by 0 days.

(21) Appl. No.: 17/940,999

(22) Filed: Sep. 8, 2022

(65) Prior Publication Data

US 2023/0078663 A1 Mar. 16, 2023

Related U.S. Application Data

(60) Provisional application No. 63/242,054, filed on Sep. 9, 2021.

(51) Int. Cl.
*G01R 31/26* (2020.01)
*G01R 1/073* (2006.01)

(52) U.S. Cl.
CPC ......... *G01R 31/2648* (2013.01); *G01R 1/073* (2013.01); *G01R 31/2601* (2013.01); *G01R 31/2607* (2013.01)

(58) Field of Classification Search
CPC .... G01R 31/26; G01R 1/073; G01R 31/2601; G01R 31/2607; G01R 31/2648
USPC ........................................................ 324/724
See application file for complete search history.

(56) References Cited

U.S. PATENT DOCUMENTS

| 6,927,569 | B2 | 8/2005 | Worledge et al. |
| 2002/0097063 | A1 | 7/2002 | Kline |
| 2008/0164872 | A1 | 7/2008 | Worledge |
| 2016/0320430 | A1 | 11/2016 | Zhu et al. |
| 2019/0310295 | A1* | 10/2019 | Osterberg .............. G01R 1/073 |
| 2021/0231731 | A1* | 7/2021 | Cagliani ................ H10N 50/80 |

FOREIGN PATENT DOCUMENTS

| EP | 3566062 | 11/2019 |
| WO | 2020/205236 A1 | 10/2020 |

OTHER PUBLICATIONS

WIPO, International Search Report for International Application No. PCT/US2022/042977, Jan. 4, 2023.
WIPO, Written Opinion of the International Searching Authority for International Application No. PCT/US2022/042977, Jan. 4, 2023.

* cited by examiner

*Primary Examiner* — Eman A Alkafawi
*Assistant Examiner* — Courtney G McDonnough
(74) *Attorney, Agent, or Firm* — Hodgson Russ LLP

(57) ABSTRACT

The multilayer test sample includes a stack with a bottom layer, a top layer, and a tunnel layer sandwiched between the bottom and top layers. The multilayer test sample has terminals below the stack for measuring on the stack. The terminals have unknown positions or distance between them. A model and a measurement strategy is defined so that material parameters of the stack may be determined.

30 Claims, 3 Drawing Sheets

METHOD FOR DETERMINING MATERIAL PARAMETERS OF A MULTILAYER TEST SAMPLE

CROSS-REFERENCE TO RELATED APPLICATIONS

This application claims priority to the provisional patent application filed Sep. 9, 2021 and assigned U.S. App. No. 63/242,054, the disclosure of which is hereby incorporated by reference.

FIELD OF THE DISCLOSURE

The present disclosure relates to a method and computer system for determining material parameters of a multilayer test sample, such as a multilayer test sample comprising a stack defining a tunnel junction (a tunnel layer sandwiched between a conductive bottom layer and a conductive top layer, the tunnel layer having a thickness such that there is a tunnelling effect of electrons between the top and bottom layers).

BACKGROUND OF THE DISCLOSURE

The multilayer test sample may be arranged as described in WO 2020/205236, which is incorporated in the present disclosure by reference. Such a multilayer test sample will be described in more detail in connection with FIGS. 1 and 2.

As will be evident from the description of FIGS. 1 and 2 the stack is contacted by terminals from the bottom in this embodiment. The terminals have fixed, but unknown, positions with respect to each other.

In addition to the terminals below the stack, the multilayer test sample has terminals for contacting electrodes of a measurement circuit. The position of these electrodes may vary with each measurement.

An example of determining position of movable electrodes that land on top of a test sample is described in EP3566062, which is incorporated in the present disclosure by reference. However, EP3566062 does not disclose how to determine material parameters in the case where the stack is contacted from below or from the top by fixed non-movable terminals.

BRIEF SUMMARY OF THE DISCLOSURE

A first aspect of the present disclosure is a method for determining material parameters of a multilayer test sample. Said multilayer test sample comprises: a stack including at a bottom layer, a top layer, and a tunnel layer sandwiched between said bottom layer and said top layer, a plurality of test sample terminals for connection with a measurement circuit such as a multi-point probe, said measurement circuit having a plurality of electrodes, and a plurality of stack terminals below or above said stack, such that each stack terminal electrically connected to said bottom layer or said top layer.

Said method comprises:
providing said multilayer test sample,
providing a resistance model representative of said multilayer test sample, said resistance model outputting a resistance value as a function of a set of stack terminal parameters and a set of stack material parameters,
providing a plurality of electrically conductive paths, each conductive path electrically interconnecting a respective test sample terminal and a respective stack terminal,
contacting said test sample terminals with said electrodes,
determining at least six different measured resistance values by means of six measurements, each measured resistance value being determined in a respective measurement by
selecting four different test sample terminals of said plurality of test sample terminals, and dividing said four different test sample terminals into a first pair of test sample terminals and a second pair of test sample terminals,
injecting a current into said test sample by means of said first pair of test sample terminals, and measuring a voltage induced between said second pair of test sample terminals, and determining each resistance value as a function of said voltage and said current,
for each measured resistance value defining a partial error function, said partial error function defining an error between said resistance model and a respective measured resistance value,
defining an error function comprising each partial error and defining a total error,
varying each set of stack terminal parameters and said set of stack material parameters in each resistance model in said error function such that said total error being minimized.

A second aspect of the present disclosure is a method for determining material parameters of a multilayer test sample. Said multilayer test sample comprises: a stack including at a bottom layer, a top layer, and a tunnel layer sandwiched between said bottom layer and said top layer, a plurality of test sample terminals for connection with a measurement circuit such as a multi-point probe, said measurement circuit having a plurality of electrodes, and a plurality of stack terminals below or above said stack, such that each stack terminal electrically connected to said bottom layer or said top layer.

Said method comprises:
providing said multilayer test sample,
providing a resistance model representative of said multilayer test sample, said resistance model outputting a resistance value as a function of a set of stack terminal parameters and a set of stack material parameters,
providing a plurality of electrically conductive paths, each conductive path electrically interconnecting a respective test sample terminal and a respective stack terminal,
contacting said test sample terminals with said electrodes,
determining at least six different measured resistance values by means of six measurements, each measured resistance value being determined in a respective measurement by
selecting four different test sample terminals of said plurality of test sample terminals, and dividing said four different test sample terminals into a first pair of test sample terminals and a second pair of test sample terminals,
injecting a current into said test sample by means of said first pair of test sample terminals, and measuring a voltage induced between said second pair of test sample terminals, and determining each resistance value as a function of said voltage and said current, for each measured resistance value defining an equation partial error function, said partial error function defining an error between said resistance model and a respective measured resistance value, defining a set of equations, each equation defining an equality between a respective measured resistance and said resistance model, solving said set of equations for said set of stack material parameters.

A third aspect of the present disclosure is a computer-based system for determining material parameters of a multilayer test sample. Said multilayer test sample comprises a stack including at a bottom layer, a top layer, and a tunnel layer sandwiched between said bottom layer and said top layer, a plurality of test sample terminals for connection with a measurement circuit such as a multi-point probe, a plurality of stack terminals below or above said stack, such that each stack terminal electrically connected to said bottom layer or said top layer, and a plurality of electrically conductive paths, each conductive path electrically interconnecting a respective test sample terminal and a respective stack terminal, Said computer-based system comprises:

a measurement system arranged for determining at least six different measured resistance values by means of six measurements, each measured resistance value being determined in a respective measurement by selecting four different test sample terminals of said plurality of test sample terminals, and dividing said four different test sample terminals into a first pair of test sample terminals and a second pair of test sample terminals, injecting a current into said test sample by means of said first pair of test sample terminals, and measuring a voltage induced between said second pair of test sample terminals, and determining each resistance value as a function of said voltage and said current, a processing unit and a memory, said memory including:

a resistance model representative of said multilayer test sample, said resistance model outputting a resistance value as a function of a set of stack terminal parameters and a set of stack material parameters, for each measured resistance value said processing unit arranged for defining a partial error function, said partial error function defining an error between said resistance model and a respective measured resistance value, defining an error function comprising each partial error and defining a total error, varying each set of stack terminal parameters and said material parameters in each resistance model such that said total error being minimized.

A respective electrode may have a varying position on a respective test sample terminal from one measurement to the next, but the resistance model may assume that the measured resistance values are independent from the positions of the plurality of electrodes on the test sample terminals.

A test sample terminal may have a larger area than a respective stack terminal.

The error function may comprise a term for each partial error function.

The error defined by each partial error function may be a difference between the resistance model and a respective measured resistance value.

The test sample comprising at least five test stack terminals. In an instance, the test sample comprises at least five test sample terminals.

The set of stack terminal parameters may comprise a distance between stack terminals. Alternatively, the set of stack terminal parameters may comprise a position of a stack terminal. In an instance, the set of stack terminal parameters comprises a position of each stack terminal.

The set of stack material parameters may comprising a sheet resistance value of the bottom layer. In an instance, this is a sheet resistance value of the top layer and a resistance value representing the tunnel/barrier layer such as the resistance area product.

In the following specific examples according to aspects of the present disclosure will be explained in more detail with reference to the accompanying drawings. The present disclosure may, however, be embodied in different forms than depicted below, and should not be construed as limited to any examples set forth herein. Rather, any examples are provided so that the disclosure will be thorough and complete, and will fully convey the scope of the invention to those skilled in the art. Like reference numerals refer to like elements throughout. Like elements will, thus, not be described in detail with respect to the description of each figure.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
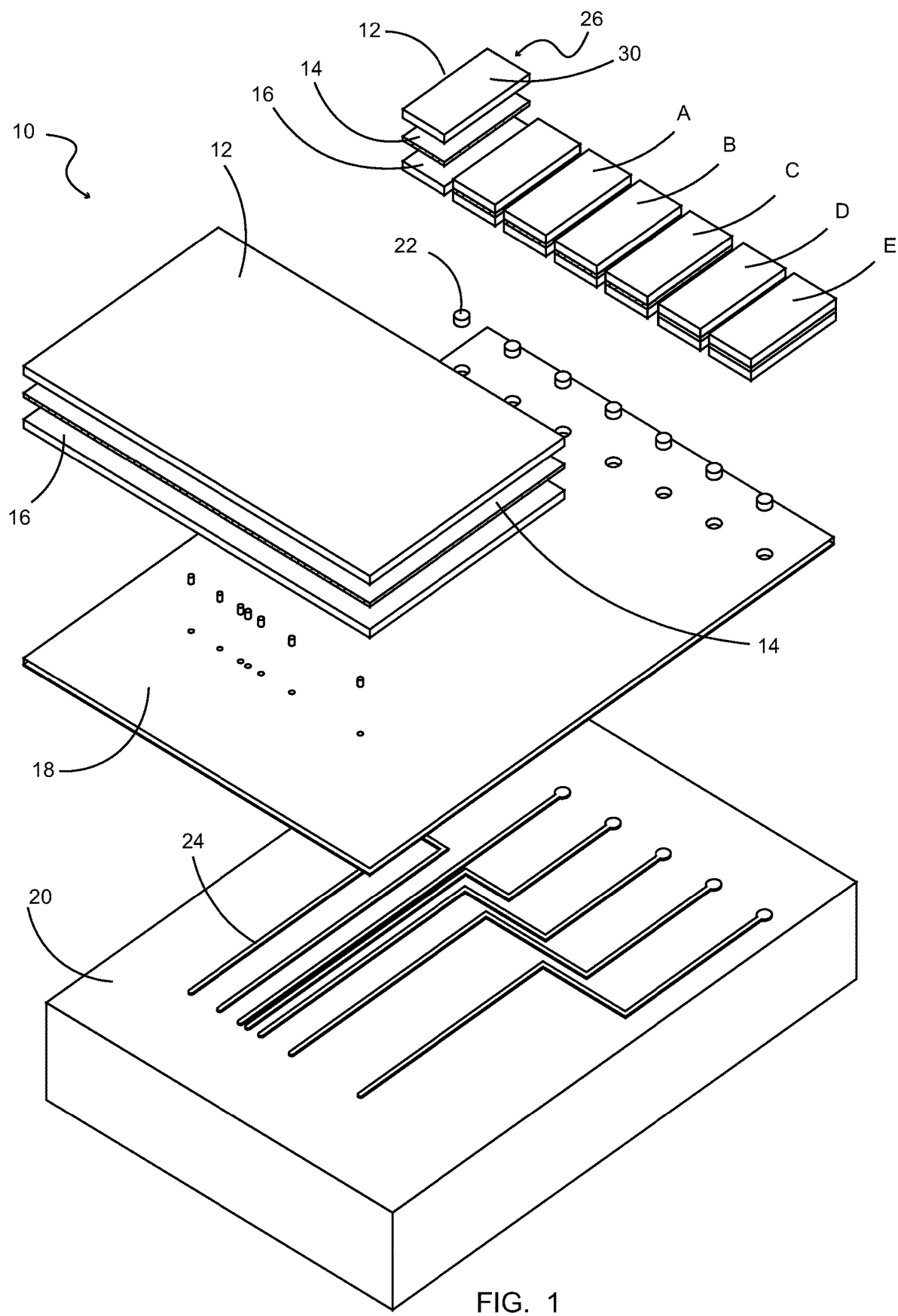
FIG. 1 shows an exploded view of a test sample.

FIG. 1 shows an exploded view of a test sample.

The test sample 10 has five layers wherein the top three layers constitute a magnetic tunnel junction (MTJ), i.e. a MTJ stack.

The test sample may constitute a semiconductor wafer comprising at least two electrically conductive layers and a tunnelling electrically insulating layer sandwiched in the middle, for example an MTJ.

The top layer 12 of the MTJ stack may or may not contain a ferromagnetic material, but it is electrically conductive.

The direction of the magnetization of the top layer may be changed.

A middle layer 14 is sandwiched between the top layer and a bottom layer 16 of the MTJ stack.

The middle layer is a thin electrically insulator—the thickness of which is not so large that electrons may not tunnel through it, i.e. the middle layer is a tunnelling barrier layer.

The bottom layer 16 may also or may not contain ferromagnetic materials, but it is electrically conductive.

Alternatively, the top layer may have a permanent magnetization, and the bottom layer may have a variable direction of the magnetic moments. Both layers may also have a variable direction of the magnetic moments.

The resistance of the stack when a voltage potential is applied across the stack could depend on if the magnetization of the top and bottom layer are parallel or antiparallel, i.e. if they are parallel, the tunnelling barrier is lower than if the magnetizations are antiparallel.

The top layer is illustrated with a planar top surface, and the layers are in general illustrated as being parallel to each other.

The stack may also have more than two conductive layers and one barrier with several electrical properties, which are to be measured.

Alternatively, the layers of the test sample may have another function than as for a MRAM cell. For example, a stack having only two layers, the purpose of which being a sensor.

The three layers of the stack are shown as eight islands in FIG. 1, i.e. seven smaller islands next to each other on a row and one larger island by itself (such as a test island constituting an MTJ stack 28 for MRAM or a sensor purpose). This is a result of etchings in the stack layers such that these islands become electrically insulated from each other, i.e. the islands are not electrically connected with each other.

The removed parts of the layers could also be constituted by oxide material or another material constituting an electrical insulator, i.e. such that the space between the islands themselves, and the space between an island and the MTJ stack is filled with an electrical insulator material.

The seven smaller islands constitute seven test sample terminals, which may have the purpose of landing pads such as a first landing pad 26 having a first landing area on top of the landing pad (i.e. the exposed surface 30), which is not covered by another layer on top of it—except for possibly a thin oxide layer.

A test sample terminal may have any in-plane shape. FIG. 1 shows rectangular shapes/areas but the shape may be round, oval, elliptic, polygonal or a random shape.

Each landing area of each landing pad is for landing a probe tip/electrode, i.e. contacting a probe tip with the landing area such that an electric signal may be injected into the landing pad during a measurement routine, or alternatively, an electric measurement signal may be picked up. In this way, terminals are provided on the test sample for a probe, and for doing a probe measurement with a measurement circuit.

Instead of using a probe, the test sample may be inserted into a measuring device wherein the measuring terminals have fixed positions aligned with the position of the test sample terminals when the test sample is placed correctly in the measuring device.

Below the MTJ stack is a fourth layer constituting a first electrically insulating layer 18, i.e. no current is intended to flow freely in that layer without control of the current path.

Below the fourth electrically insulating layer is the fifth layer constituting a second electrically insulating layer 20.

The first electrically insulating layer, and the second electrically insulating layer may be made as one electrically insulating layer.

The first electrically insulating layer has vias such as a first via 22 extending vertically throughout the thickness of the layer.

Seven vias are located shown under the larger island, which all go into contact with the bottom surface of the bottom layer of the MTJ stack, and constitute terminals for contacting the MTJ stack.

As an alternative, the stack terminals may contact the top layer from above. It is contemplated that a number of layers may be above the top layer of the stack and that the stack terminals goes through these layers.

The sample terminals may be in a layer higher than the layer that the stack terminals are in, whether the stack terminals connect to the bottom layer of the stack or the top layer of the stack.

In the second electrically insulating layer are seven copper lanes, i.e. copper deposited during one of the fabrication steps (another electrically conductive material than copper may be used).

The copper lanes constitute electrically conductive paths such as a first electrically conductive path 24.

The electrically conductive paths extend parallel with the layers and each electrically conductive path interconnects a via for one landing pad with one of the vias contacting the MTJ stack.

One of the electrically insulating layers may also be used for electrically connections leading to for example control electronics such as a switch. The switch itself may be placed in a sixth layer, which may be lower than the electrically insulating layer.

A landing pad may not necessarily be constituted by three MTJ layers. Alternatively, the landing pad may be a semiconductor material deposited or otherwise created on the first electrically insulating layer as an island which may conduct an electric signal from a probe tip to the via, which contacts the respective landing pad from below.

Five of the test sample terminals have been designated the letters A to E.

Figure 2:
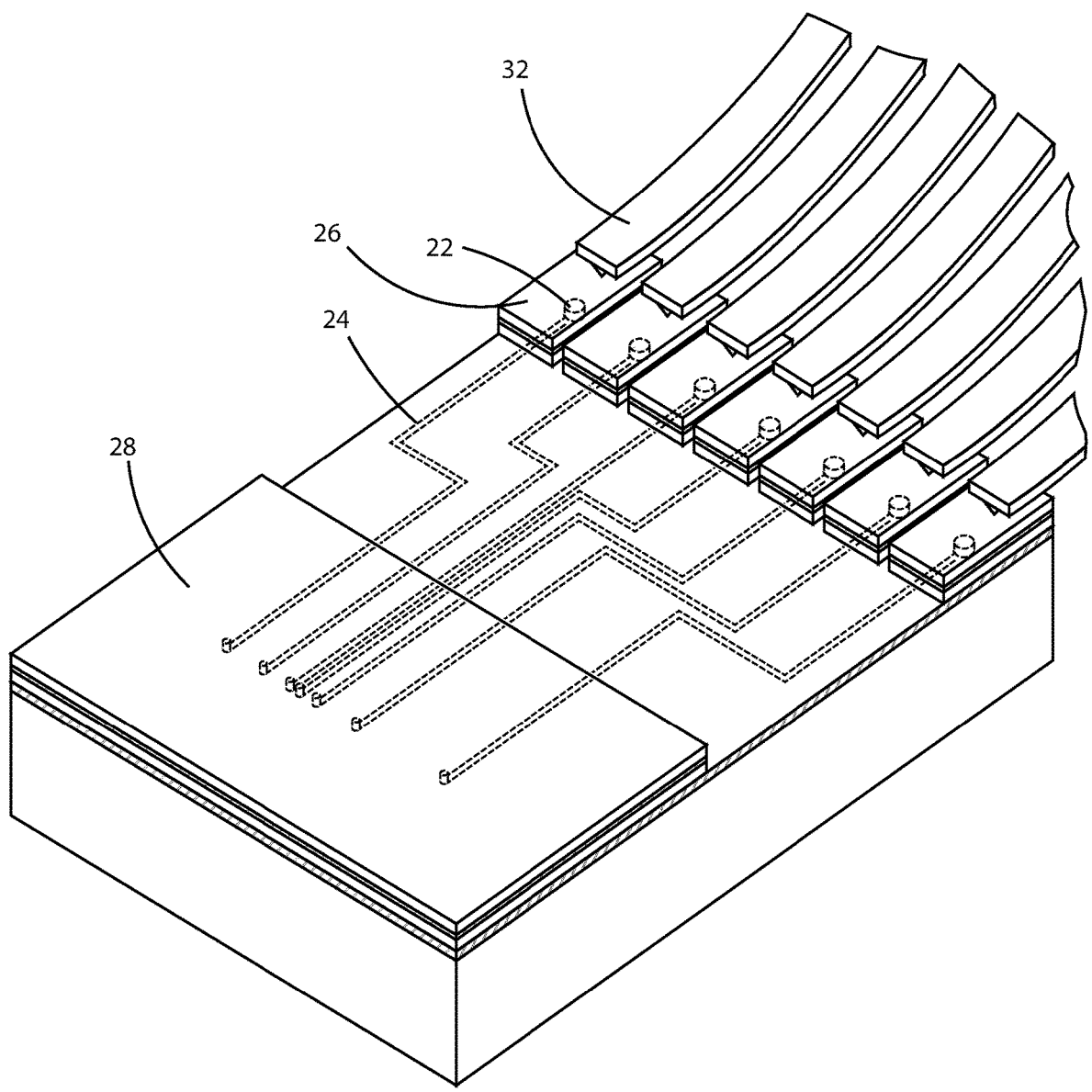
FIG. 2 shows a test sample connected to electrodes.

In FIG. 2, a probe has been placed above the test sample.

The test sample is shown in a non-exploded view. The vias and electrically conductive paths are illustrated as dotted lines below the top three layers.

The probe has seven cantilever arms extending parallel to each other. Each cantilever arm ending in a probe tip/electrode such as a first probe tip 32.

Each respective probe tip has been brought into contact with the landing areas of each respective landing pad, i.e. the first probe tip 32 contacts the first landing pad 26 with the first via 22 contacting the first landing pad from below.

The probe tip may penetrate a possible oxide layer on top of the landing pad such that an electric contact may be established between the landing pad and the probe tip.

A probe tip may penetrate the landing pad a small distance so that it not only rests on the surface constituting the landing area.

The vias and electrically conductive paths enable a circuit path to be completed from one probe tip to another such that a current may be injected into the circuit path and go into the MTJ stack and further to a second probe tip.

Figure 3:
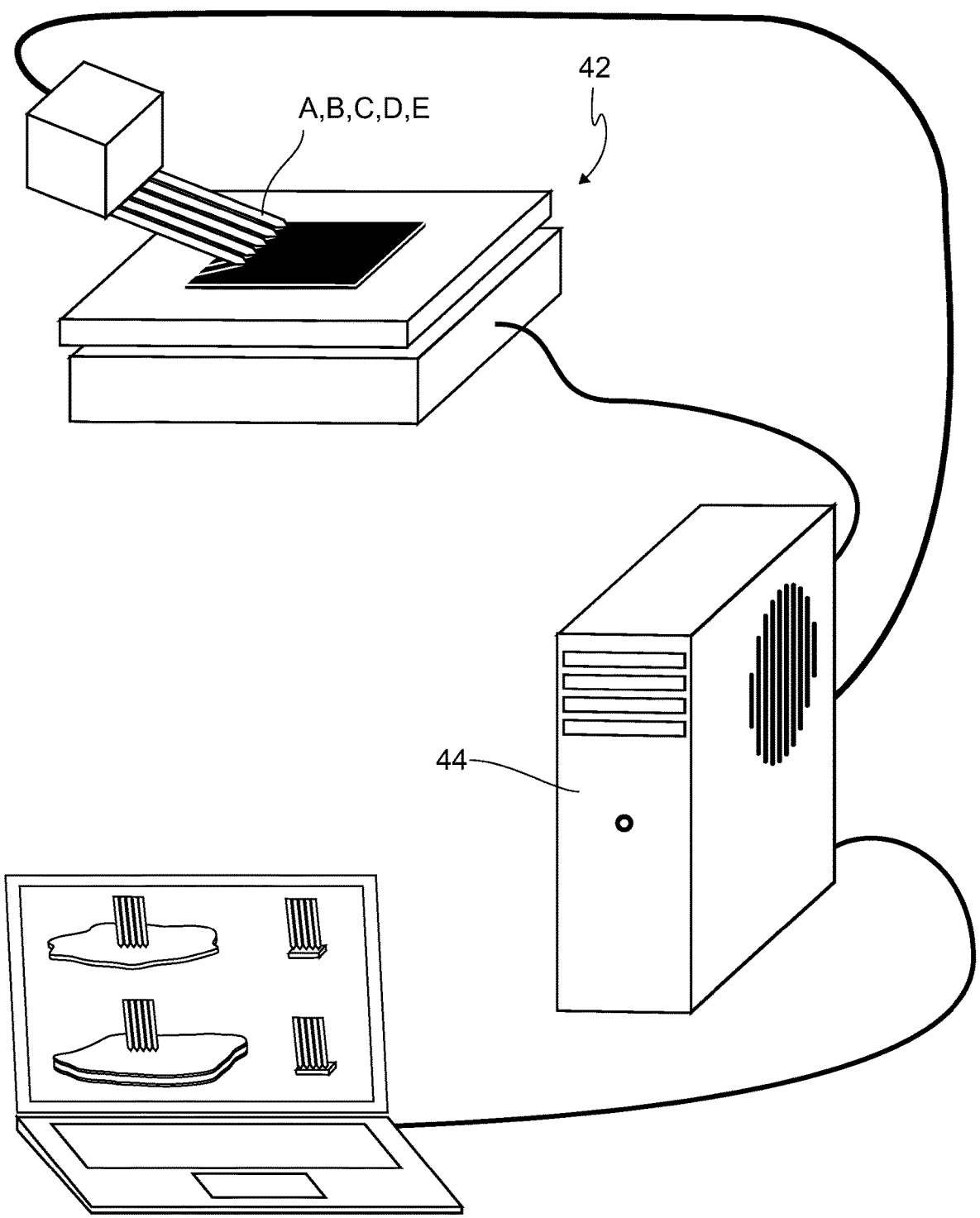
FIG. 3 shows a schematic perspective view of a computer-based system for measuring a multilayer test sample.

FIG. 3 shows a schematic perspective view of a computer-based system for measuring a multilayer test sample.

The computer-based system comprises a measurement circuit 42 including a multi-probe measurement setup connected to a stationary computer 44 and/or a laptop for controlling the measurements. The stationary computer 44 and/or a laptop and the sub-systems therein can include any suitable processor (or processing unit) known in the art, such as a parallel processor. In addition, the sub-system(s) or system(s) may include a platform with high speed processing and software, either as a standalone or a networked tool. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. Moreover, different sub-systems of the stationary computer 44 and/or a laptop may include one or more computing or logic systems. Therefore, the above description should not be interpreted as a limitation on the present disclosure but merely an illustration.

The multi point probe includes the five electrodes designated A-E in FIG. 1, and they are in contact with the multilayer test sample as shown in FIG. 2.

The multilayer test sample measurement may then begin. As a first step, a model for the resistance of the stack may be defined as:

$$R^i = \frac{R_T R_B}{2\pi(R_T + R_B)} \left\{ \frac{R_T}{R_B}\left(K_0\left(\frac{w^i}{\lambda}\right) + K_0\left(\frac{z^i}{\lambda}\right) - K_0\left(\frac{y^i}{\lambda}\right) - K_0\left(\frac{x^i}{\lambda}\right)\right) + \ln\left(\frac{x^i y^i}{z^i w^i}\right) \right\}$$

$$\lambda = \sqrt{\frac{RA}{R_T + R_B}}$$

where the index i refers to the different resistance measurements (1-6) and $x^i$, $y^i$, $z^i$ and $w^i$ are distances between the five stack terminals below the stack, which are connected to the test sample terminals A-E, in the i configuration for the specific $R^i$ measurement.

The only electrode interdistance assumed to be known may be the distance between the two outermost stack terminals (connected to test sample terminals A and E respectively). Instead, all the other distances between the stack terminals are to be determined, i.e.

$x^i$ are unknown and may define the distance between the two stack terminals connected to test sample terminals A and B respectively or other inter electrode distances.

$y^i$ are unknown and may define the distance between the two stack terminals connected to test sample terminals B and C respectively or other inter electrode distances.

$z^i$ is unknown and may define the distance between the two stack terminals connected to test sample terminals C and D respectively or other inter electrode distances.

$w^i$ is unknown and may define the distance between the two stack terminals connected to test sample terminals D and E respectively or other inter electrode distances.

The unknown material parameters are the top layer sheet resistance $R_T$, the bottom layer sheet resistance $R_B$, and the tunnelling resistance area product RA.

$K_0$ is the modified Bessel function of the second kind, O'th order.

The method assumes that, unlike the prior art, the measured resistance is independent of the landing position of the movable electrodes of the measurement circuit. Thus, the variables/parameters relating to the geometric relation between the electrodes and the test sample terminals do not enter into the resistance model. Instead, the parameters defining the distances between the fixed stack terminals is used to define a relationship between resistance of the test sample $R^i$ and the test sample parameters ($R_T$, $R_B$, $R_A$), and enters the resistance model as ($x^i$, $y^i$, $z^i$, $w^i$).

However, depending on the size of the test sample terminals this assumption behind the model in the present disclosure may lead to an error if the test sample terminals become smaller, and necessitating that for example the distances between the test sample terminals ($\chi$, $\gamma$, $\sigma$, $\omega$) enters the equation (resistance model) as well where $\chi$ is known within an error margin and may define the distance between the two electrodes in contact with test sample terminals A and B respectively. $\gamma$ is known within an error margin and may define the distance between the two electrodes in contact with test sample terminals B and C respectively. $\sigma$ is known within an error margin and may define the distance between the two electrodes in contact with test sample terminals C and D respectively. $\omega$ defines the distance between the electrodes connected to the two outermost test sample terminals (A and E respectively) and is estimated (set as a constant).

The test sample terminals used in each of the six measurements may be defined as follows:

| Measurement # | Voltage pairs | Current pairs |
| --- | --- | --- |
| 1 | A, C | B, E |
| 2 | A, C | B, D |
| 3 | A, E | B, C |
| 4 | A, E | B, D |
| 5 | B, D | C, E |
| 6 | B, C | A, D |

At least one of the pins are to be changed from one measurement to the other.

Thus, for the first measurement, in a first step, a current is injected into the test sample by the electrodes contacting test sample terminals B and E on FIG. 1 respectively.

A voltage is measured in a second step by the electrodes contacting test sample terminals A and C on FIG. 1 respectively.

The resistance may then be determined in a third step by means of Ohm's law from the injected current and measured voltage.

The above three steps are then repeated with the voltage and current pairs defined in the above table until six measured resistance values have been determined.

The resistance model has been chosen to approximate or model the measured resistance. The difference or error between a measured resistance and the model may be:

$$f(\hat{p},\hat{d}) = R_m - R(\hat{p},\hat{d})$$

where the vector p are the material parameters $R_T$, $R_B$, $R_A$ and the vector d are the distances between the stack terminals used in the measurement. Since these are fixed, but unknown (except one stack interterminal distance which is assumed to be known), there are a total of six unknown parameters in the function f (i.e. three from the sample, three from the fixed stack terminals distances). However, with six measurements six equations may be established and solved for the six unknown parameters.

Alternatively, for each measured resistance value a (partial) error function may be defined, which defines an error or difference between the (output of the) resistance model and a respective measured resistance value.

All of the six partial error functions may enter into a (total) error function and each set of stack terminal parameters and the set of stack material parameters in each resistance model in the total error function may be varied such that the total error is minimized.

The error function defining a total error may be defined as:

$$\epsilon = |R_m^1 - R^1(\hat{p},\hat{d}^1)| + |R_m^2 - R^2(\hat{p},\hat{d}^2)| + |R_m^3 - R^3(\hat{p},\hat{d}^3)| + |R_m^3 - R^3(\hat{p},\hat{d}^3)| + |R_m^4 - R^4(\hat{p},\hat{d}^4)| \ldots + |R_m^5 - R^5(\hat{p},\hat{d}^5)| + |R_m^6 - R^6(\hat{p},\hat{d}^6)|$$

The variation of parameters may proceed until a change in error is less than a threshold, for example when varying a parameter up to 5% or 10% and the error does not decrease with more than for example 1%. In this case the material parameters are said to be determined and having a value for which the error no longer changes substantially.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

The invention claimed is:

1. A method for determining material parameters of a multilayer test sample, said method comprising:
providing a multilayer test sample, said multilayer test sample comprising:
a stack including a bottom layer, a top layer, and a tunnel layer sandwiched between said bottom layer and said top layer,
a plurality of test sample terminals for connection with a measurement circuit, said measurement circuit having a plurality of electrodes, and
a plurality of stack terminals below or above said stack, such that each of said stack terminals is electrically connected to said bottom layer or said top layer,
providing a resistance model representative of said multilayer test sample, said resistance model outputting a resistance value as a function of a set of stack terminal parameters and a set of stack material parameters, wherein said set of stack terminal parameters comprises a distance between stack terminals,
providing a plurality of electrically conductive paths, each of said conductive paths electrically interconnecting one of said test sample terminals and one of said stack terminals,
contacting said test sample terminals with said electrodes,
determining at least six different measured resistance values using six measurements, each of said measured resistance values being determined in one of said measurements by:
selecting four different test sample terminals of said plurality of test sample terminals, and dividing said four different test sample terminals into a first pair of test sample terminals and a second pair of test sample terminals, and
injecting a current into said multilayer test sample using said first pair of test sample terminals, measuring a voltage induced between said second pair of test sample terminals, and determining each of said measured resistance values as a function of said voltage and said current,
for each of said measured resistance values defining a partial error function, said partial error function defining an error between said resistance model and one of said measured resistance values,
defining an error function comprising each partial error and defining a total error, and
varying each of said set of stack terminal parameters and said set of stack material parameters in each of said resistance models in said error function such that said total error is minimized.

2. The method according to claim 1, further comprising solving said set of equations for said set of stack terminal parameters.

3. The method according to claim 1, where each of said stack terminals has a fixed position.

4. The method according to claim 1, wherein one of said electrodes has a varying position on one of said test sample terminals from one measurement to the next.

5. The method according to claim 1, wherein said resistance model assumes said measured resistance values are independent from positions of said plurality of electrodes on said test sample terminals.

6. The method according to claim 1, comprising landing said plurality of electrodes on said test sample terminals.

7. The method according to claim 1, wherein each of said test sample terminals has a larger area than one of said stack terminals.

8. The method according to claim 1, wherein said error function comprises a term for each of said partial error functions.

9. The method according to claim 1, wherein said error is defined by each of said partial error functions as a difference between said resistance model and one of said measured resistance values.

10. The method according to claim 1, wherein said test sample comprises at least five test stack terminals.

11. The method according to claim 1, wherein said set of stack terminal parameters further comprises a position of a stack terminal or a position of each of said stack terminals.

12. The method according to claim 1, wherein said set of stack material parameters comprises a resistance value of said bottom layer and optionally of said top layer and/or said tunnel layer.

13. The method according to claim 1, wherein said multilayer test sample includes an electrically insulating layer.

14. The method according to claim 13, wherein said plurality of electrically conductive paths are embedded in said electrically insulating layer.

15. A method for determining material parameters of a multilayer test sample, said method comprising:
providing said multilayer test sample, said multilayer test sample comprising:
a stack including a bottom layer, a top layer, and a tunnel layer sandwiched between said bottom layer and said top layer,
a plurality of test sample terminals for connection with a measurement circuit, said measurement circuit having a plurality of electrodes, and
a plurality of stack terminals below or above said stack, such that each of said stack terminals electrically connected to said bottom layer or said top layer,
providing a resistance model representative of said multilayer test sample, said resistance model outputting a resistance value as a function of a set of stack terminal parameters and a set of stack material parameters, wherein said set of stack terminal parameters comprises a distance between stack terminals,
providing a plurality of electrically conductive paths, each of said electrically conductive paths electrically interconnecting one of said test sample terminals and one of said stack terminals,
contacting said test sample terminals with said electrodes,
determining at least six different measured resistance values using six measurements, each of said measured resistance values being determined in a respective measurement by:
selecting four different test sample terminals of said plurality of test sample terminals, and dividing said four different test sample terminals into a first pair of test sample terminals and a second pair of test sample terminals, and
injecting a current into said test sample using said first pair of test sample terminals, measuring a voltage induced between said second pair of test sample terminals, and determining each of said measured resistance values as a function of said voltage and said current, for each measured resistance value defining a partial error function, said partial error function defining an error between said resistance model and one of said measured resistance values, defining a set of equations, each of said set of equations defining an equality between one of said measured resistance values and said resistance model, and solving said set of equations for said set of stack material parameters.

16. The method according to claim 15, further comprising solving said set of equations for said set of stack terminal parameters.

17. The method according to claim 15, where each of said stack terminals has a fixed position.

18. The method according to claim 15, wherein one of said electrodes has a varying position on one of said test sample terminals from one measurement to the next.

19. The method according to claim 15, wherein said resistance model assumes said measured resistance values are independent from positions of said plurality of electrodes on said test sample terminals.

20. The method according to claim 15, comprising landing said plurality of electrodes on said test sample terminals.

21. The method according to claim 15, wherein each of said test sample terminals has a larger area than one of said stack terminals.

22. The method according to claim 15, wherein said error function comprises a term for each of said partial error functions.

23. The method according to claim 15, wherein said error is defined by each of said partial error functions as a difference between said resistance model and one of said measured resistance values.

24. The method according to claim 15, wherein said test sample comprises at least five test stack terminals.

25. The method according to claim 15, wherein said set of stack terminal parameters further comprises a position of a stack terminal or a position of each of said stack terminals.

26. The method according to claim 15, wherein said set of stack material parameters comprises a resistance value of said bottom layer and optionally of said top layer and/or said tunnel layer.

27. The method according to claim 15, wherein said multilayer test sample includes an electrically insulating layer.

28. The method according to claim 27, wherein said plurality of electrically conductive paths are embedded in said electrically insulating layer.

29. A computer-based system for determining material parameters of a multilayer test sample, said multilayer test sample that includes a stack including a bottom layer, a top layer, and a tunnel layer sandwiched between said bottom layer and said top layer; a plurality of test sample terminals for connection with a measurement circuit; a plurality of stack terminals below or above said stack, such that each of said stack terminals electrically connected to said bottom layer or said top layer; and a plurality of electrically conductive paths, each of said conductive paths electrically interconnecting one of said test sample terminals and one of said stack terminals, said computer-based system comprising:

a measurement system arranged for determining at least six different measured resistance values using six measurements, each of said measured resistance values being determined in a respective measurement by:
selecting four different test sample terminals of said plurality of test sample terminals, and dividing said four different test sample terminals into a first pair of test sample terminals and a second pair of test sample terminals, and
injecting a current into said multilayer test sample using said first pair of test sample terminals, measuring a voltage induced between said second pair of test sample terminals, and determining each of said measured resistance values as a function of said voltage and said current, and a processing unit and a memory, said memory including:
a resistance model representative of said multilayer test sample, said resistance model outputting a resistance value as a function of a set of stack terminal parameters and a set of stack material parameters, wherein said set of stack terminal parameters comprises a distance between stack terminals, for each of said measured resistance values said processing unit configured to:
define a partial error function, said partial error function defining an error between said resistance model and one of said measured resistance values,
define an error function comprising each of said partial errors and defining a total error, and
vary each of said set of stack terminal parameters and said material parameters in said resistance model such that said total error is minimized.

30. The computer-based system according to claim 29, wherein said set of stack terminal parameters further comprises a position of a stack terminal or a position of each of said stack terminals.

* * * * *